United States Patent [19]

Yamaguchi et al.

[11] Patent Number: 4,825,110
[45] Date of Patent: Apr. 25, 1989

[54] DIFFERENTIAL AMPLIFIER CIRCUIT

[75] Inventors: Takashi Yamaguchi; Yasuo Kobayashi, both of Tokyo, Japan

[73] Assignee: NEC Corporation, Tokyo, Japan

[21] Appl. No.: 917,137

[22] Filed: Oct. 9, 1986

[30] Foreign Application Priority Data

Oct. 9, 1985 [JP] Japan .............................. 60-226121
Dec. 20, 1985 [JP] Japan .............................. 60-288717

[51] Int. Cl.⁴ .................... G01R 19/01; H03K 17/16; H03K 19/017
[52] U.S. Cl. ................... 307/530; 307/443; 307/448; 365/205; 365/207
[58] Field of Search ............ 307/443, 448, 450, 297, 307/530, 354; 365/205, 207

[56] References Cited

FOREIGN PATENT DOCUMENTS 0113483 7/1982 Japan .................................. 365/205
0100291 6/1983 Japan .................................. 365/205

OTHER PUBLICATIONS

Research Disc., 6/85, #254.

Primary Examiner—John S. Heyman
Assistant Examiner—M. R. Wambach
Attorney, Agent, or Firm—Sughrue, Mion, Zinn, Macpeak & Seas

[57] ABSTRACT

A differential amplifier circuit comprising first and second input lines to which potentials with a slight difference therebetween are to be applied, a series combination of a first load transistor and a first amplifier transistor provided between sources of voltage of high and low levels, a series combination of a second load transistor and a second amplifier transistor provided between the sources of the voltages of high and low levels, and activating means provided in association with the first and second amplifier transistors for activating each of the first and second amplifier transistors when the activating means is actuated, each of the first and second load transistors, the first and second amplifier transistors and the activating transistor having a control terminal, the control terminal of the first amplifier transistor being connected to the first input line and the control terminal of the second amplifier transistor being connected to the second input line, characterized by current cutoff means provided in association with the first and second load transistors and responsive to the potentials applied to the first and second input lines, the current cutoff means being operative to electrically isolate one of the first and second amplifier transistors from the source of the voltage of high level in response to variation in the voltage on one of the first and second input lines.

4 Claims, 9 Drawing Sheets

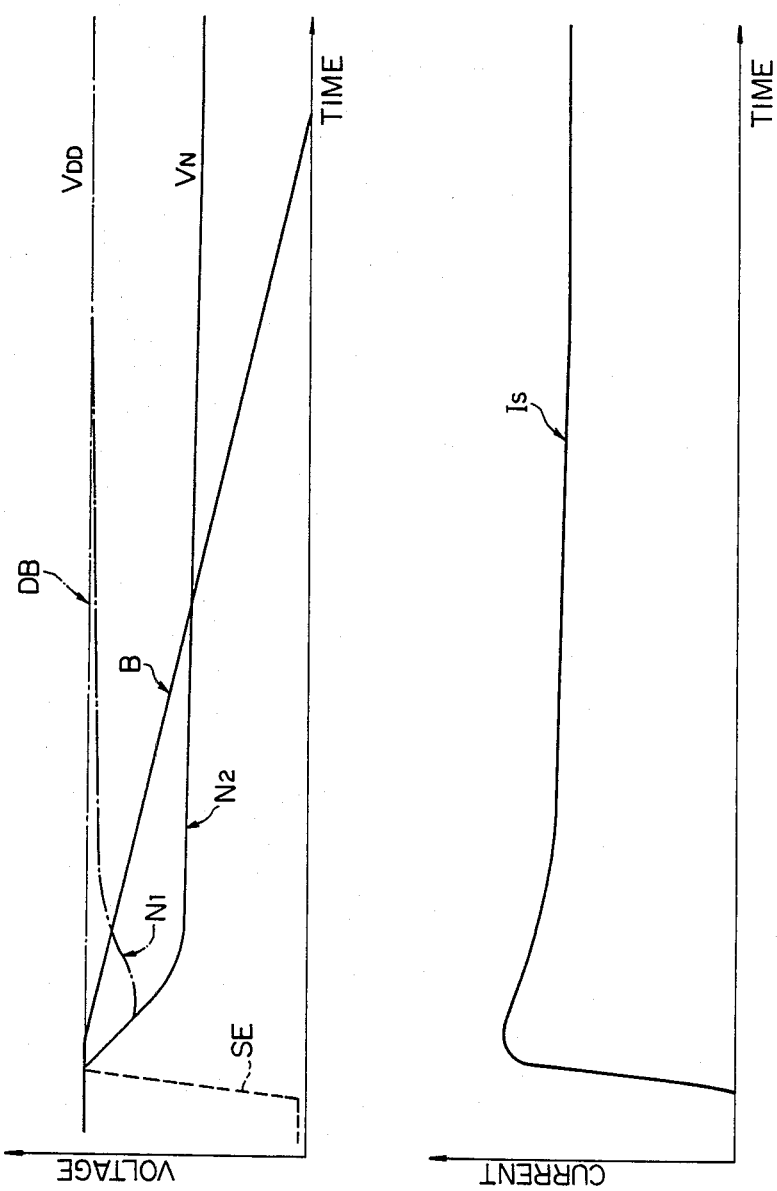

DIFFERENTIAL AMPLIFIER CIRCUIT

FIELD OF THE INVENTION

The present invention relates to a differential amplifier circuit and, more particularly, to a differential amplifier circuit useful typically as a sense amplifier for use in a semiconductor memory device.

BACKGROUND OF THE INVENTION

A semiconductor memory device has a sense amplifier designed to detect a slight difference between the potentials on two mutually associated bit lines of a memory array which consists of a multiplicity of memory cells. Such a differential voltage between the two bit lines is detected upon amplification by the sense amplifier. The two bit lines may consist of either a pair of mutually complementary bit lines or a bit line and a dummy bit line associated therewith.

In a known sense amplifier for a semiconductor memory device of, for example, the static type, one of the two sets of series connected transistors provided between the supply voltage line and the activating transistor of the amplifier must be maintained in conduction states for a substantial period of time during each of the read cycles of the device. A path of current is thus formed through one set of the series connected transistors for a substantial period of time during each read cycle. A considerably large amount of steady-state current flows to ground through this current path, thus giving rise to an increase in the amount of power dissipation by the memory device.

It is accordingly a prime object of the present invention to provide an improved differential amplifier circuit in which the path of current which would otherwise be formed unnecessarily in the circuit during each cycle of operation of the circuit is cut off in response to variation in the voltage input to the circuit.

SUMMARY OF THE INVENTION

In accordance with the present invention, there is provided a differential amplifier circuit comprising (a) first and second input lines to which potentials with a slight difference therebetween are to be applied, (b) a series combination of a first load transistor and a first amplifier transistor provided between sources of voltage of high and low levels, (c) a series combination of a second load transistor and a second amplifier transistor provided between the sources of the voltages of high and low levels, and (d) activating means provided in association with the first and second amplifier transistors for activating each of the first and second amplifier transistors when the activating means is actuated, (e) each of the first and second load transistors, the first and second amplifier transistors and the activating transistor having a control terminal, the control terminal of the first amplifier transistor being connected to the first input line and the control terminal of the second amplifier transistor being connected to the second input line, characterized by (f) current cutoff means provided in association with the first and second load transistors and responsive to the potentials applied to the first and second input lines, the current cutoff means being operative to electrically isolate one of the first and second amplifier transistors from the source of the voltage of high level in response to variation in the voltage on one of the first and second input lines.

BRIEF DESCRIPTION OF THE DRAWINGS

The drawbacks of a prior-art sense amplifier and the features and advantages of a differential amplifier circuit according to the present invention will be more clearly understood from the following description taken in conjunction with the accompanying drawings in which like reference numerals designate similar or corresponding units and elements and in which:

FIGS. 4A and 4B are timecharts showing examples of the waveforms of various voltages and currents to appear in the circuit arrangement of the sense amplifier shown in FIG. 3;

DESCRIPTION OF THE PRIOR ART

Figure 1:
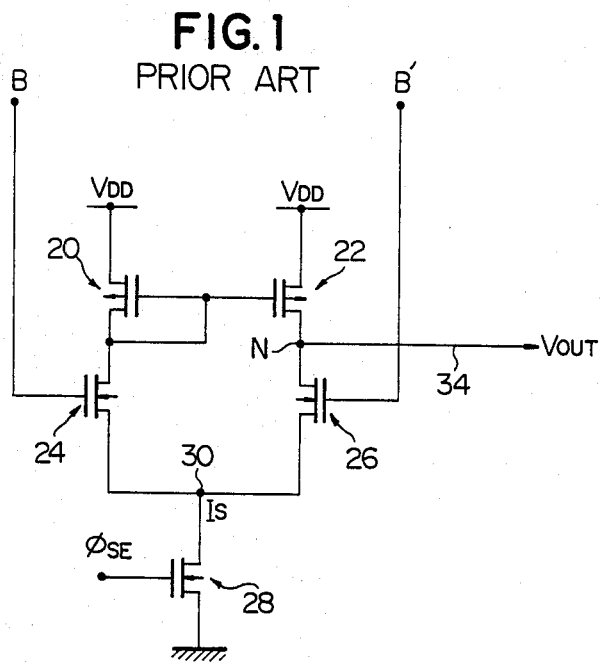
FIG. 1 is a circuit diagram showing the circuit arrangement of a representative example of a prior-art sense amplifier for a static semiconductor memory device.

In FIG. 1 of the drawings, a known sense amplifier for use in a static semiconductor memory device is shown provided in association with a pair of mutually complementary bit lines B and B'. These complementary bit lines B and B' represent a multiplicity of bit lines provided in combination with word lines in a memory array consisting of a number of memory cells, though not shown in the drawings.

The prior-art sense amplifier thus provided between the bit lines B and B' includes a pair of load transistors 20 and 22 each provided by a p-channel MOS (metal-oxide-semiconductor) field-effect transistor and a pair of amplifier transistors 24 and 26 each provided by an n-channel MOS field-effect transistor. The load transistors 20 and 22 have their sources connected to a voltage supply line for a positive supply voltage $V_{DD}$ and their drains connected to the drains of the amplifier transistors 24 and 26, respectively. Furthermore, the load transistors 20 and 22 have their gates commonly connected to the common drains of the load and amplifier transistors 20 and 24. The amplifier transistors 24 and 26 have their gates connected to the bit lines B and B', respectively, and their sources commonly connected to ground line commonly through an activating transistor 28 which is provided by an n-channel MOS field-effect transistor. The activating transistor 28 has its drain connected to the respective sources of the amplifier transistors 24 and 26 through a common node 30, its source connected to ground line, and its gate connected to a clock supply line 32 for an active-high clock signal $\phi_{SE}$. The load and amplifier transistors 22 and 26 further have their drains commonly connected through a node N to an output line 34 to produce an output signal $V_{OUT}$ as being representative of the bit of information read out from the memory device during each read cycle.

Figures 2A, 2B:
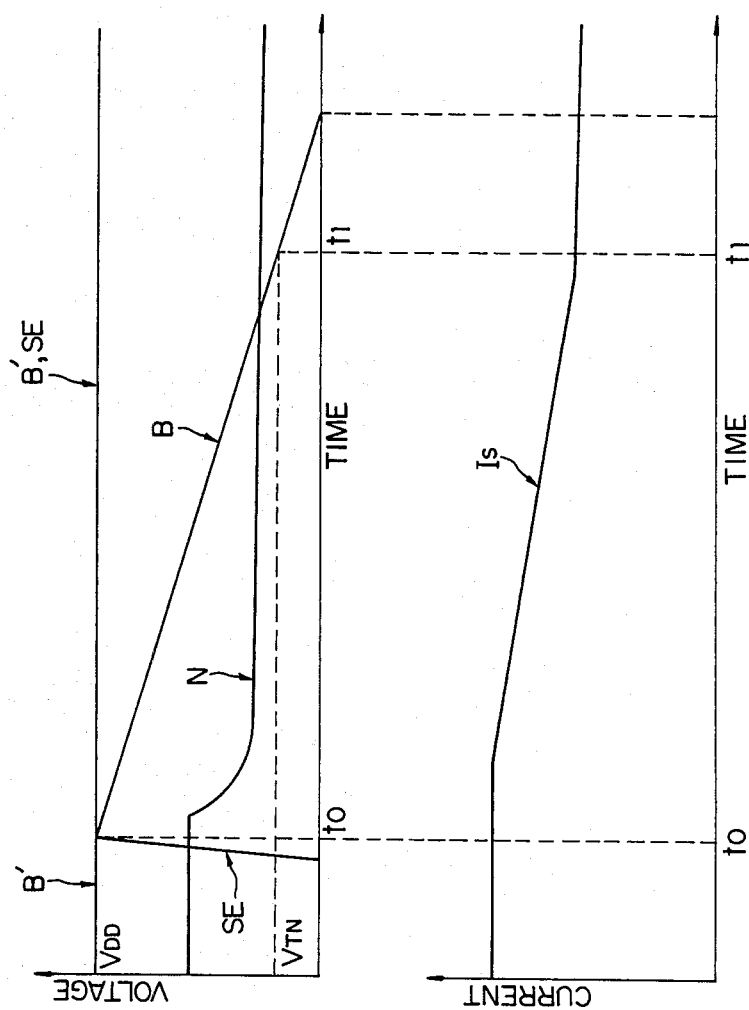
FIGS. 2A and 2B are timecharts showing examples of the waveforms of various voltages and currents to appear in the circuit arrangement of the sense amplifier shown in FIG. 1.

Operation of the prior-art sense amplifier thus constructed and arranged will now be described with reference to FIG. 1 and further to FIGS. 2A and 2B. In FIG. 2A, lines indicated by B and B' represent the potentials which occur on the true and complementary bit lines B and B', respectively, and curve N represents the potential which occurs at the output node N. Furthermore, it is assumed for purposes of discussion that the memory cell selected during the read cycle under consideration has a logic "0" bit of information. Under such a condition, a voltage approximating the ground level $V_{SS}$ is to appear on the bit line B and a voltage approximating the supply voltage $V_{DD}$ is to appear on the complementary bit line B' during the current read cycle.

At an incipient stage of the read cycle, the bit lines B and B' are precharged toward a level approximately equal to the supply voltage $V_{DD}$ (of, for example, 5 volts). After the bit lines B and B' are thus precharged, the potentials at the bit lines B and B' are allowed to float at a high level approximating the supply voltage $V_{DD}$. The potentials of such high levels established at the gates of the amplifier transistors 24 and 26 maintain each of the n-channel field-effect transistors 24 and 26 ready to turn on. When the memory cell storing the logic "0" bit of information is thereafter selected and is connected to the bit line pair B/B̄ at time $t_0$ (FIG. 2A), the potential on the true bit line B declines gradually toward the ground level $V_{SS}$ with the potential on the complementary bit line B' maintained at the level approximating the supply voltage $V_{DD}$ as will be seen from FIG. 2A. The clock signal $\phi_{SE}$ on the clock supply line 32 swings to a high level ($V_{DD}$) also at time $t_0$ and is supplied to the gate of the activating transistor 28, as will be also seen from FIG. 2A. The activating transistor 28 is now turned on so that the potential at the common node 30 between the amplifier transistors 24 and 26 drops from the level approximating the supply voltage $V_{DD}$ toward the ground level $V_{SS}$ through the transistor 28. With the potentials of the high levels present at the gates of the amplifier transistors 24 and 26 at time $t_0$, each of the n-channel field-effect transistors 24 and 26 is allowed to turn on also at time $t_0$.

The potential at the common node being reduced to the ground level, there are created differential voltages between the bit line B and the common node 30 and between the bit line B' and the common node 30. The potential on the bit line B being on the decline as shown in FIG. 2A, the differential voltage produced between the gate and source of the amplifier transistor 24 becomes lower than the differential voltage between the gate and source of the amplifier transistor 26. It therefore follows that the channel conductance of the amplifier transistor 26 becomes higher than that of the amplifier transistor 24 with a higher potential present at the complementary bit line B' than at the true bit line B. The transistor 26 being thus higher in channel conductance than the transistor 24, the potential at the output node N drops toward a certain level (indicated by $V_N$ in FIG. 2A) at a higher rate than the potential at the drain of the amplifier transistor 24. The particular level $V_N$ to which the potential at the output node N is thus reduced is dictated by the on-state resistances of the series connected transistors 22, 26 and 28. The voltage of such a level $V_N$ produced at the output node N is supplied through the output line 34 to an external device such as typically a microprocessor (not shown) as an output signal $V_{OUT}$ representative of the logic "0" bit of information read out from the memory array during the current read cycle. When the differential voltage between the gate and source of the amplifier transistor 24 is thereafter reduced below the level of the threshold voltage $V_{TN}$ of the n-channel field-effect transistor 24, the transistor 24 is turned off as at time $t_1$ with the corresponding transistor 26 maintained in the conduction state.

Figure 3:
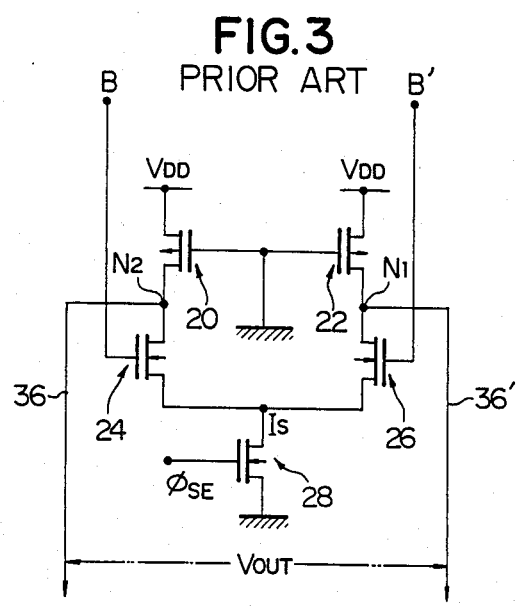
FIG. 3 is a circuit diagram showing the circuit arrangement of another representative example of a prior-art sense amplifier for a semiconductor memory device.

FIG. 3 shows another representative example of a known sense amplifier for use in a static semiconductor memory device. The sense amplifier herein shown is basically similar construction to the prior-art sense amplifier described with reference to FIG. 1 but is arranged in conjunction with a bit line B and a dummy bit line DB. In association with each of the dummy bit line DB is provided a dummy cell which is one of the dummy cells provided along a dummy word line, though not shown in the drawings. The bit line B and dummy bit line DB are also connected to precharge transistors though not shown in the drawings.

The prior-art sense amplifier shown in FIG. 3 is provided in association with these bit line B and dummy bit line DB and comprises p-channel load transistors 20 and 22 and n-channel amplifier transistors 24 and 26 and an n-channel activating transistor 28, similarly to the sense amplifier described with reference to FIG. 1. In the sense amplifier herein shown, the load transistors 20 and 22 have their gates commonly connected to ground line to provide certain on-state resistances. Between the common drains of the load and amplifier transistors 20 and 24 and the common drains of the load and amplifier transistors 24 and 26 are provided first and second sense nodes $N_1$ and $N_2$ from which first and second output lines 36 and 36' lead to an external device such as a microprocessor (not shown).

In operation, the bit line B and dummy bit line DB are precharged toward a level approximately equal to the supply voltage $V_{DD}$ at an incipient stage of a read cycle. When a memory cell storing, for example, a logic "0" bit of information is selected, the potential on the bit line B declines gradually toward the ground level $V_{SS}$ with the potential on the dummy bit line DM maintained at the level approximating the supply voltage $V_{DD}$ as will be seen from FIG. 4A. In FIG. 4A, lines indicated by B and DB represent the potentials which occur on the bit line B and dummy bit line DM, respectively, and curves indicated by $N_1$ and $N_2$ represent the potentials which occur at the first and second sense nodes $N_1$ and $N_2$, respectively.

The clock signal $\phi_{SE}$ on the clock supply line 32 now swings to a high level ($V_{DD}$) and is supplied to the gate of the activating transistor 28, as will be also seen from FIG. 4A. The activating transistor 28 is now turned on so that the potential at the common node 30 between the amplifier transistors 24 and 26 drops toward the ground level $V_{SS}$ through the transistor 28. With the potentials of the high levels present at the gates of the amplifier transistors 24 and 26, each of the n-channel field-effect transistors 24 and 26 is allowed to turn on. The potential at the node 30 being reduced to the ground level, a differential voltage is created between the common node 30 and each of the bit line B and dummy bit line DM. The potential on the bit line B being on the decline, the voltage thus produced between the gate and source of the amplifier transistor 24 becomes lower than the voltage between the gate and source of the amplifier transistor 26 with the result that the channel conductance of the transistor 26 becomes higher than that of the transistor 24. The transistor 26 being thus higher in channel conductance than the transistor 24, the potential at the second sense node $N_2$ drops at a higher rate than the potential at the first sense node $N_1$ toward a certain level $V_{N2}$ dictated by the on-state resistances of the series connected transistors 22, 26 and 28. As the potential on the bit line B further declines, the differential voltage between the gate and source of the amplifier transistor 24 is reduced to the level of the threshold voltage of the transistor 24, the transistor 24 is turned off so that the potential at the first sense node $N_1$ rises toward the initial level approximating the supply voltage $V_{DD}$. The differential voltage between the bit line B and dummy bit line DM is in these manners amplified into the differential voltage ($V_{DD}-V_{N2}$) between the first and second sense nodes $N_1$ and $N_2$. Such an amplified differential voltage $V_{DD}-V_{N2}$ is supplied to the external device as an output signal $V_{OUT}$ representative of the logic "0" bit of information read out from the memory array.

In each of the the prior-art sense amplifiers constructed and arranged as hereinbefore described, either the load and amplifier transistors 22 and 26 or the load and amplifier transistors 20 and 24 must be maintained in conduction states for a substantial period of time during each read cycle. During each read cycle of the device, the first load and amplifier transistors 20 and 24 must be maintained conductive until a logic "1" bit of information has been read out and the load and amplifier transistors 22 and 26 must be maintained conductive until a logic "0" bit of information has been read out from the memory array. A path of current is thus formed through the series connected transistors 20, 24 and 28 or the series connected transistors 22, 26 and 28 for a substantial period of time during each read cycle. A considerably large amount of steady-state current is allowed to flow through this current path even after the amplifier transistor 24 or 26 has been turned off, as will be seen from the curves shown in FIGS. 2B and 4B. This gives rise to an increase in the amount of power dissipation by the memory device using the sense amplifier under consideration.

DESCRIPTION OF THE PREFERRED EMBODIMENTS

A differential amplifier circuit embodying the present invention is assumed to be incorporated in a semiconductor memory device having memory cells arranged in rows along a plurality of word lines and in columns along a plurality of bit lines. Of these word lines and bit lines provided in the memory device, only a pair of mutually complementary bit lines B and B' are shown FIG. 5 as being representative of the bit lines. These bit lines B and B' are connected to a row of memory cells with each of the word lines connected to a column of memory cells as well known in the art. These memory cells thus arranged in rows and columns along the bit lines and word lines are herein assumed to be of the static type by way of example. Each of these memory cells has stored therein a logic "0" or "1" bit of information if the cell is of the ROM (read only memory) type or is capable of storing such a bit of information therein if the cell is of the RAM (random access memory) type. Such a memory cell is implemented by, for example, a complementary metal-oxide-semiconductor (CMOS) device or a plurality of such devices.

Though not shown in the drawings, there are further provided precharge transistors including those respectively associated with the bit lines B and B'. Each of these precharge transistors is provided by a p-channel or n-channel MOS field-effect transistor having its gate connected to a source of an active-low or active-high precharge enable signal and its source-drain current path connected to a source of, typically, a supply voltage $V_{DD}$. At an incipient stage of each read cycle, the bit lines B and B' are thus precharged to a voltage approximating the supply voltage $V_{DD}$ through such precharge transistors. The precharge transistors are activated to turn on in response to the transition of the precharge enable signal to either a low level or a high level depending upon the type of the semiconductor device forming each precharge transistor, as also well known in the art.

The differential amplifier circuit embodying the present invention is in part similar in construction and arrangement to the prior-art sense amplifier described with reference to FIG. 1 and comprises first and second load transistors 20 and 22 and first and second amplifier transistors 24 and 26. Each of the load transistors 20 and 22 is provided by a p-channel MOS field-effect transistor and each of the amplifier transistors 24 and 26 is provided by an n-channel MOS field-effect transistor. The first and second load transistors 20 and 22 have their drains connected to the drains of the first and second amplifier transistors 24 and 26, respectively. These load transistors 20 and 22 have their gates commonly connected to the common drains of the first load and amplifier transistors 20 and 24. The first and second amplifier transistors 24 and 26 have their gates connected to the true and complementary bit lines B and B', respectively, and their sources commonly connected to ground line through an activating transistor 28. The activating transistor 28, which is provided by an n-channel MOS field-effect transistor, has its drain connected to the respective sources of the first and second amplifier transistors 24 and 26 through a common node 30, its source connected to ground line, and its gate connected to a clock supply line 32 for an active-high clock signal $\phi_{SE}$. The activating transistor 28 is to be driven to turn on by the clock signal $\phi_{SE}$ of a certain high level and the second load and amplifier transistors 22 and 26 have their drains commonly connected through a node N to an output line 34 to produce an output signal $V_{OUT}$ as in the prior-art sense amplifier shown in FIG. 1.

Figure 5:
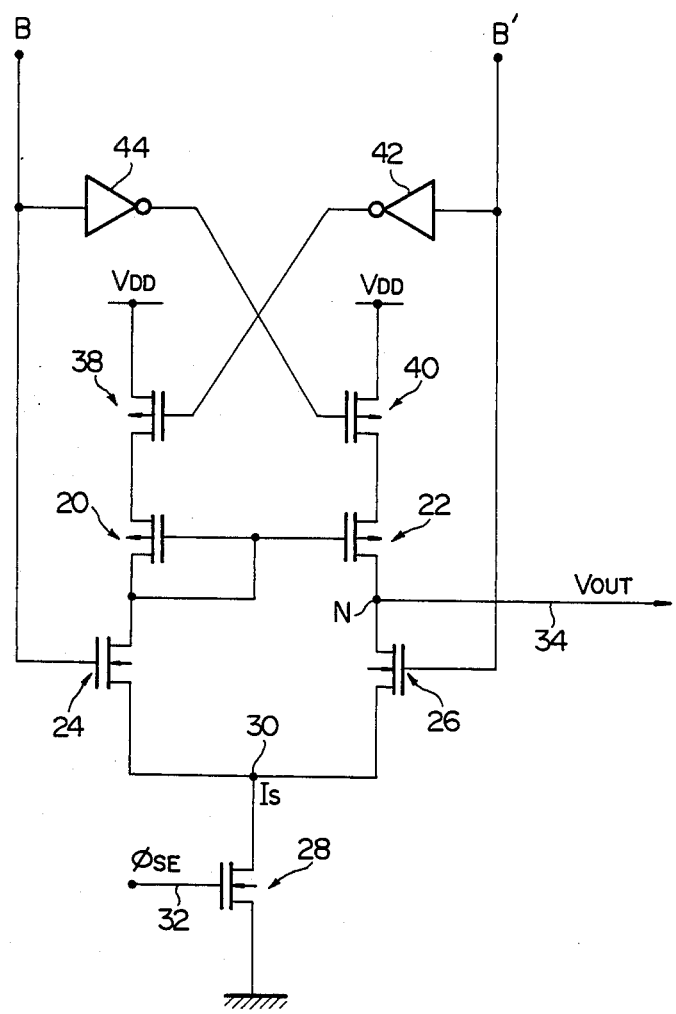
FIG. 5 is a circuit diagram showing the circuit arrangement of a first preferred embodiment of a differential amplifier circuit according to the present invention.

In accordance with the present invention, the differential amplifier circuit shown in FIG. 5 further comprises first and second current cutoff transistors 38 and 40 each of which is provided by a p-channel MOS field-effect transistor. These first and second current cutoff transistors 38 and 40 have their sources connected to a voltage supply line for the supply voltage $V_{DD}$, and their drains connected to the sources of the first and second load transistors 20 and 22, respectively. The current cutoff transistors 38 and 40 further have their gates connected to the complementary and true bit lines B' and B through first and second inverters 42 and 44 as shown. It will thus be seen that signals $\overline{B}$ and $\overline{DB}$ respectively inverted from the signals which appear on the true and complementary bit lines B and B' are to be produced at the gates of the transistors 38 and 40.

Figures 6A, 6B:
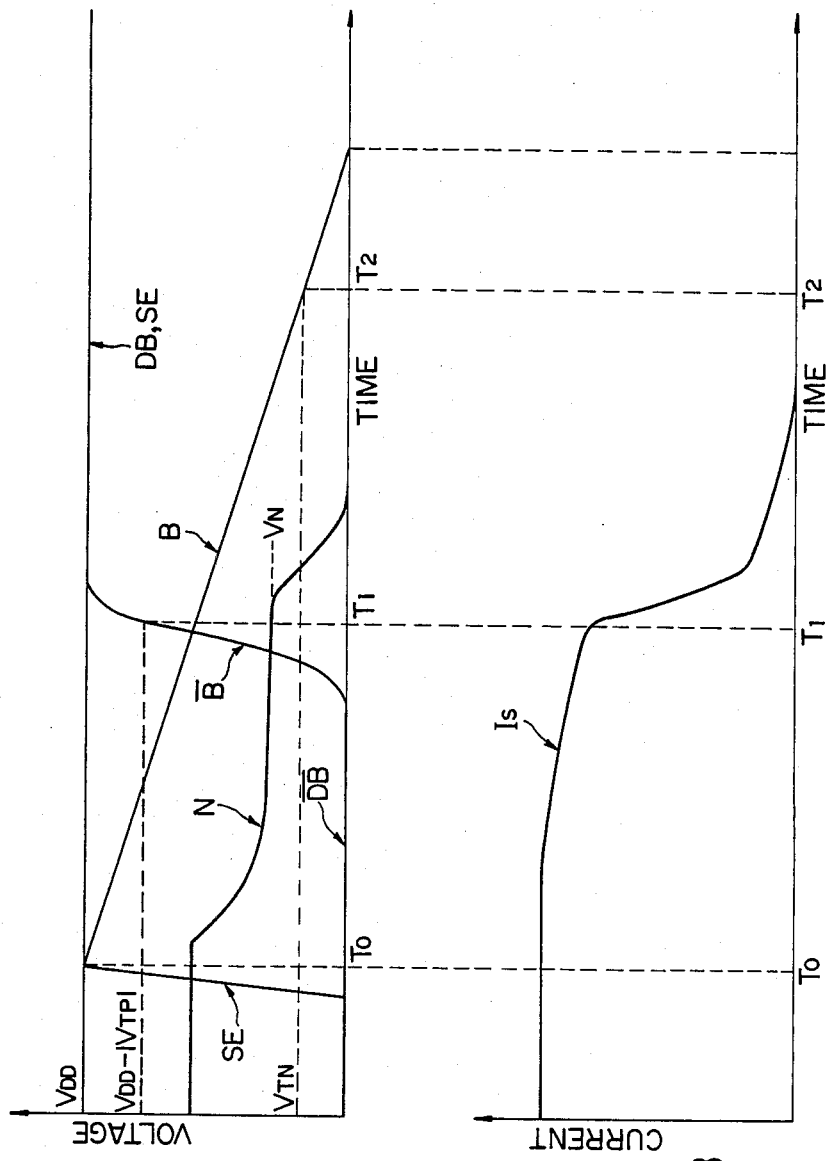
FIGS. 6A and 6B are timecharts showing examples of the waveforms of various voltages and currents to appear in the circuit arrangement of the sense amplifier circuit shown in FIG. 5.

Operation of the differential amplifier circuit thus constructed and arranged will now be described with reference to FIG. 5 and further to FIGS. 6A and 6B. In FIG. 6A, curves indicated by $\overline{DB}$ and $\overline{B}$ represent the potentials which occur at the output terminals of the first and second inverters 42 and 44, respectively.

In response to an access request signal supplied from an external source such as typically a microprocessor (not shown), the memory device is initiated into action to read out the information stored in any of the memory cells of the device. The precharge enable signal now swings to a high level or a low level and is supplied to the gate of each of the precharge transistors associated with the bit lines B and B'. Each of the true and complementary bit lines B and B' thus begins to be precharged toward a level approximately equal to the supply voltage $V_{DD}$ (of, for example, 5 volts). After the bit lines B and B' are fully precharged, the precharge transistors are turned off so that the potentials at the bit lines B and B' thereafter float at high levels each approximating the supply voltage $V_{DD}$. With the potentials of such high levels established at the bit lines B and B', potentials of low levels approximating the ground level $V_{SS}$ appear at the outputs of the first and second inverters 42 and 44. Such low potential levels present at the gates of the first and second current cutoff transistors 38 and 40 maintain each of the p-channel field-effect transistors 38 and 40 in a conduction state. Furthermore, the potentials of the high levels established at the gates of the first and second amplifier transistors 24 and 26 maintain each of the n-channel field-effect transistors 24 and 26 ready to turn on.

For purposes of discussion, it will also be assumed that the memory cell selected during the read cycle under consideration has a logic "0" bit of information. With the logic "0" storing memory cell thus selected, a voltage approximating the ground level $V_{SS}$ is to appear on the bit line B and a voltage approximating the supply voltage $V_{DD}$ is to appear on the complementary bit line B' during the current read cycle.

The particular memory cell storing the logic "0" bit of information is selected out of the memory cells arranged along the bit line pair B/$\overline{B}$ and is connected to the bit line pair B/$\overline{B}$ at time $T_0$ (FIG. 6A). Accordingly, the potential on the true bit line B declines after time $T_0$ gradually toward the ground level $V_{SS}$ with the potential on the complementary bit line B' maintained at the initial level approximating the supply voltage $V_{DD}$ as will be seen from FIG. 6A. This results in development of an increasing differential voltage between the true and complementary bit lines B and B'. The clock signal $\phi_{SE}$ on the clock supply line 32 swings to a high level ($V_{DD}$) also at time $T_0$ and is supplied to the gate of the activating transistor 28, as will be also seen from FIG. 6A. The activating transistor 28 is driven to turn on so that the potential at the common node 30 between the respective sources of the amplifier transistors 24 and 26 drops from the level approximating the supply voltage $V_{DD}$ toward the ground level $V_{SS}$ through the transistor 28. There are now created a differential voltage between the bit line B and the common node 30, viz., between the gate and source of the first amplifier transistor 24 and a differential voltage between the bit line B' and the common node 30, viz., between the gate and source of the second amplifier transistor 26.

With the potentials of the high levels present at the gates of the first and second amplifier transistors 24 and 26 at time $T_0$, each of the n-channel field-effect transistors 24 and 26 is allowed to turn on also at time $T_0$. The potential on the bit line B being currently on the decline as shown in FIG. 6A, the differential voltage present between the gate and source of the first amplifier transistor 24 becomes lower than the differential voltage between the gate and source of the second amplifier transistor 26. Accordingly, the channel conductance of the second amplifier transistor 26 becomes higher than that of the first amplifier transistor 24 with a higher potential present at the bit line B' than at the bit line B. The transistor 26 being thus higher in channel conductance than the transistor 24, the charges which have been accumulated at the output node N between the common drains of the load and amplifier transistors 22 and 26 are passed to ground line through the transistors 26 and 28 at a higher rate than the charges passed to the ground line through the transistors 24 and 28. Thus, the potential at the output node N drops at a higher rate than the potential at the node between the common drains of the first load and amplifier transistors 20 and 24 toward a certain level $V_N$ dictated by the respective on-state resistances of the series connected transistors 40, 22, 26 and 28. The voltage $V_N$ now present at the output node N is supplied through the output line 34 to the external device (not shown) as an output signal $V_{OUT}$ representative of the logic "0" bit of information read out from the memory array during the current read cycle.

With the potential of a high level established at the complementary bit line B', the first current cutoff transistor 38 is maintained in a conduction state in response to the potential of the ground level $V_{SS}$ present as the inverted signal $\overline{DB}$ at the gate of the p-channel field-effect transistor 38 through the first inverter 42. On the other hand, the potential which appears as the inverted signal $\overline{B}$ at the gate of the second current cutoff transistor 40 gradually rises with a consequent decrease in the voltage between the potential at the gate of the current cutoff transistor 40 and the supply voltage $V_{DD}$, viz., the differential voltage between the gate and source of the second current cutoff transistor 40. The voltage between the gate and source of the transistor 40 is thus reduced below the threshold voltage $V_{TP}$ of the transistor 40 to cause the transistor 40 to turn off at time $T_1$ as shown in FIG. 6A, with the result that the current $I_S$ which is allowed to pass through the activating transistor 28 steeply drops at time $T_1$ as will be seen from FIG.

6B. With the second current cutoff transistor 40 turned off, furthermore, the potential at the output node N declines from the level $V_N$ to the ground level $V_{SS}$ immediately after time $T_1$ as will be seen from FIG. 6A.

As the potential on the bit line B further declines, the differential voltage between the gate and source of the first amplifier transistor 24 is reduced below the level of the threshold voltage $V_{TN}$ of the n-channel field-effect transistor 24, the transistor 24 is turned off as at time $T_2$ so that the current $I_S$ through the activating transistor 28 is reduced to the zero level as will be also seen from FIG. 6B.

Figure 7:
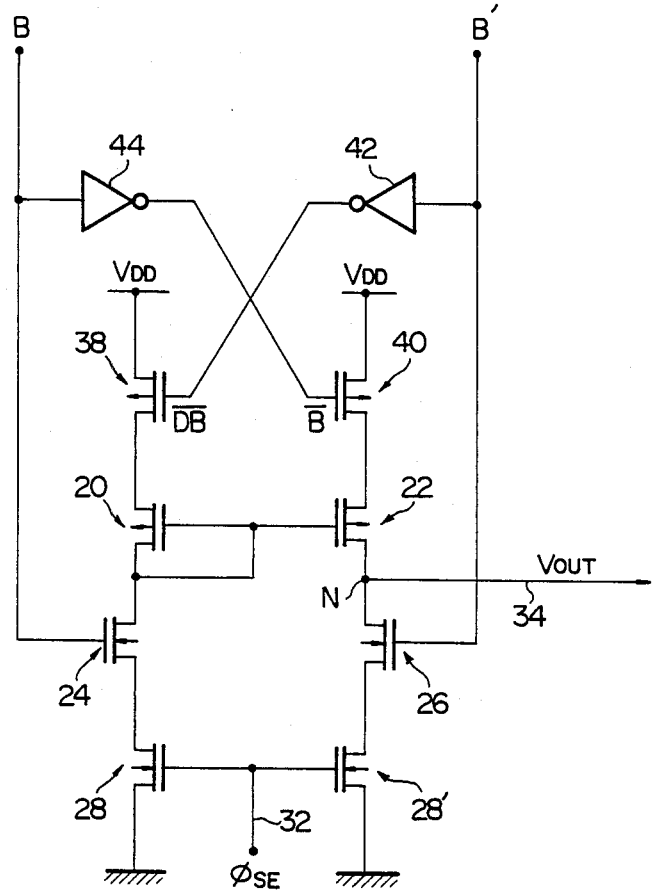
FIG. 7 is a circuit diagram showing the circuit arrangement of a second preferred embodiment of a differential amplifier circuit according to the present invention, the second embodiment being a modification of the embodiment shown in FIG. 5.

FIG. 7 shows a second preferred embodiment of a differential amplifier circuit according to the present invention. The differential amplifier circuit herein shown features first and second activating transistors 28 and 28' in lieu of the single activating transistor 28 provided in the embodiment described with reference to FIG. 5. These first and second activating transistors 28 and 28' are provided by n-channel MOS field-effect transistors and have their drains connected to the sources of the first and second amplifier transistors 24 and 26, their sources connected to ground line, and their gates commonly connected to a clock supply line 32 for an active-high clock signal $\phi_{SE}$. The activating transistors 28 and 28' are operative to have the drains of the respectively associated amplifier transistors 24 and 26 connected to ground therethrough in response to the clock signal $\phi_{SE}$ of a certain high level.

Figure 8:
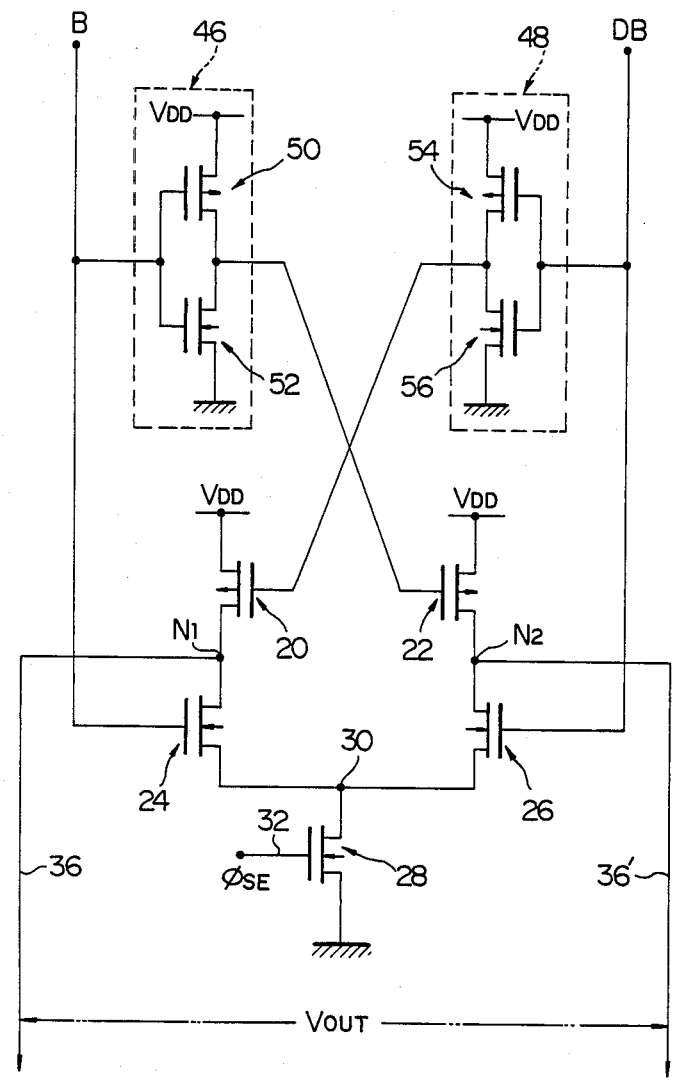
FIG. 8 is a circuit diagram showing the circuit arrangement of a third preferred embodiment of a differential amplifier circuit according to the present invention.

FIG. 8 shows a third preferred embodiment of a differential amplifier circuit according to the present invention. The differential amplifier circuit herein shown is basically similar in construction to the prior-art sense amplifier described with reference to FIG. 3 and features the provision of first and second current cutoff means in addition to the transistors 20, 22, 24, 26 and 28 provided in association with a bit line B and a dummy bit line DM in the sense amplifier of FIG. 3. These first and second current cutoff means are respectively implemented by first and second complementary metal-oxide-semi-conductor (CMOS) inverters 46 and 48. As will be understood as the description proceeds, however, the transistors 20 and 22 of the embodiment herein shown are used as current control transistors, exactly not as load transistors.

The first CMOS inverter 46 consists, in effect, of a series combination of a p-channel field-effect 50 and an n-channel field-effect transistor 52 and, likewise, the second CMOS inverter 48 consists in effect of a series combination of a p-channel field-effect 54 and an n-channel field-effect transistor 56. The p-channel transistors 50 and 54 have their sources connected to a voltage supply line for a positive supply voltage $V_{DD}$ and their drains connected to the drains of the n-channel transistors 52 and 56, respectively, which have their sources connected to ground line. The p-channel and n-channel transistors 50 and 52 of the first CMOS inverter 46 have their gates commonly connected to the bit line B and, likewise, the p-channel and n-channel transistors 50 and 52 of the second CMOS inverter 48 have their gates commonly connected to the dummy bit line DM. The common drains of the transistors 50 and 52 of the first CMOS inverter 46 are connected at a first common node $N_3$ to the gate of the second load transistor 22 and, likewise, the common drains of the transistors 54 and 56 of the second CMOS inverter 48 are connected at a second common node $N_4$ to the gate of the first load transistor 20 as shown. As in the prior-art sense amplifier shown in FIG. 3, these first and second load transistors 20 and 22 are provided by p-channel MOS field-effect transistors and have their sources connected to the voltage supply line for the supply voltage $V_{DD}$, their drains connected to the drains of the first and second amplifier transistors 24 and 26, respectively. The first and second amplifier transistors 24 and 26, which are provided by n-channel MOS field-effect transistors, have their gates connected to the bit line B and dummy bit line DM, respectively, and their sources commonly connected to ground line through the activating transistor 28. The activating transistor 28 is provided by an n-channel MOS field-effect transistor and has its drain connected to the respective sources of the first and second amplifier transistors 24 and 26 through a common node 30, its source connected to ground line, and its gate connected to a clock supply line 32 for an active-high clock signal $\phi_{SE}$. Between the common drains of the load and amplifier transistors 20 and 24 and the common drains of the load and amplifier transistors 24 and 26 are provided first and second sense nodes $N_1$ and $N_2$ from which first and second output lines 36 and 36' lead to an external device such as a microprocessor (not shown).

Figure 9:
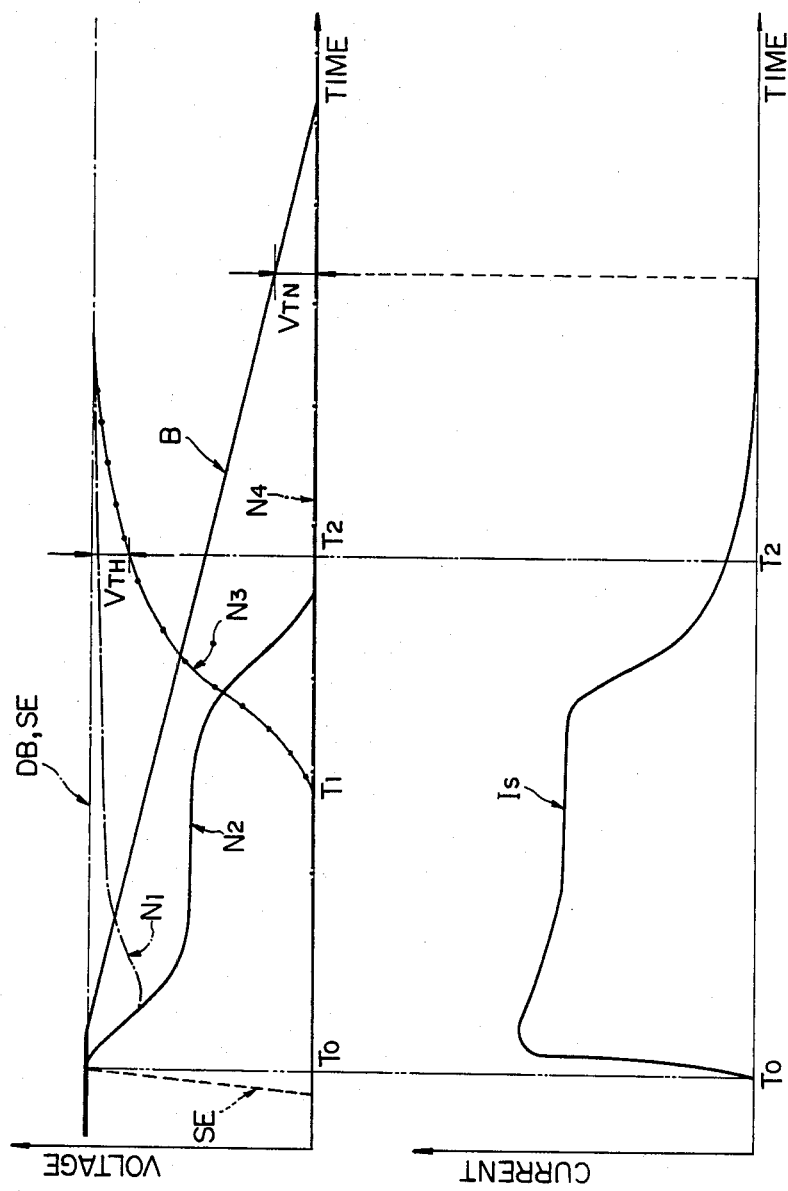
FIGS. 9A and 9B are timecharts showing examples of the waveforms of various voltages and currents to appear in the circuit arrangement of the sense amplifier circuit shown in FIG. 8.

Operation of the differential amplifier circuit thus constructed and arranged will now be described with reference to FIG. 8 and further to FIGS. 9A and 9B. In FIG. 9A, curves indicated by $N_1$ and $N_2$ represent the potentials which occur at the first and second sense nodes $N_1$ and $N_2$, respectively, and curves indicated by $N_3$ and $N_4$ represent the potentials which occur at the first and second common nodes $N_3$ and $N_4$, respectively.

In operation, the bit line B and dummy bit line DB are precharged toward a level approximately equal to the supply voltage $V_{DD}$ at an incipient stage of a read cycle. The potentials of high levels thus established at the precharged bit line B and dummy bit line DM are applied to the gates of the first and second amplifier transistors 24 and 26 maintain each of the n-channel field-effect transistors 24 and 26 ready to turn on. When a memory cell storing, for example, a logic "0" bit of information is selected, the potential on the bit line B begins to decline as at time $T_0$ toward the ground level $V_{SS}$ with the potential on the dummy bit line DM maintained at the level approximating the supply voltage $V_{DD}$ as will be seen from FIG. 9A. This results in development of an increasing differential voltage between the bit line B and dummy bit line DM. The clock signal $\phi_{SE}$ on the clock supply line 32 swings to a high level ($V_{DD}$) also at time $T_0$ and is supplied to the gate of the activating transistor 28, as will be also seen from FIG. 9A. The activating transistor 28 is driven to turn on so that the potential at the common node 30 between the amplifier transistors 24 and 26 drops from the level approximating the supply voltage $V_{DD}$ toward the ground level $V_{SS}$ through the transistor 28. There are now created a differential voltage between the bit line B and the common node 30, viz., between the gate and source of the first amplifier transistor 24 and a differential voltage between the dummy bit line DM and the common node 30, viz., between the gate and source of the second amplifier transistor 26.

With the potentials of the high levels present at the gates of the first and second load transistors 20 and 22 at time $T_0$, each of the n-channel field-effect transistors 20 and 22 is allowed to turn on also at time $T_0$. The potential on the bit line B being on the decline, the differential voltage thus produced between the gate and source of the first amplifier transistor 24 becomes lower than the voltage between the gate and source of the second amplifier transistor 26 with the result that the channel conductance of the transistor 26 becomes higher than that of the transistor 24. The transistor 26 being thus higher in channel conductance than the transistor 24, the potential at the second sense node $N_2$ drops at a higher rate than the potential at the first sense node $N_1$ toward a certain level $V_{N2}$ dictated by the on-state resistances of the series connected transistors 22, 26 and 28. As the potential on the bit line B further declines, the differential voltage between the gate and source of the first amplifier transistor 24 is reduced to the level of the threshold voltage of the transistor 24, the transistor 24 is turned off so that the potential at the first sense node $N_1$ rises toward the initial level approximating the supply voltage $V_{DD}$. The differential voltage between the bit line B and dummy bit line DM is in these manners amplified into the differential voltage $V_{DD}-V_{N2}$ between the first and second sense nodes $N_1$ and $N_2$. Such an amplified differential voltage $V_{DD}-V_{N2}$ produced between the output lines 36 and 36′ to the external device such as a microprocessor (not shown) as an output signal $V_{OUT}$ representative of the logic "0" bit of information read out from the memory array.

The potentials of high levels being present at the bit line B and dummy bit line DM at time $T_0$, the n-channel transistors 52 and 56 of the first and second CMOS inverters 46 and 48, respectively, are activated to turn on with the p-channel transistors 50 and 54 maintained in non-conduction states. The first and second common nodes $N_1$ and $N_2$ of the CMOS inverters 46 and 48 are therefore connected to ground line and isolated from the supply voltage $V_{DD}$ by means of the p-channel transistors 50 and 54 so that the p-channel first and second load transistors 20 and 22 are maintained conductive during an incipient stage of the read cycle. As the potential on the bit line B declines thereafter, the n-channel transistor 52 of the first CMOS inverter 46 is turned off and, in turn, the p-channel transistor 50 of the CMOS inverter 46 begins to turn on as at time $T_1$ to produce at the first common node $N_3$ of the CMOS inverter 46 a potential increasing toward the supply voltage $V_{DD}$ as will be seen from curve $N_3$ in FIG. 9A. In response to such an increasing voltage now present at the gate of the second load transistor 22, the channel conductance of the p-channel transistor 22 decreases with a consequence decrease in the current which flows through the transistor 22 as will be seen from FIG. 6B. The second load transistor 22 is thus turned off as at time $T_2$ when the difference between the potential at the first common node $N_3$ and the supply voltage $V_{DD}$, viz., the differential voltage between the gate and source of the second load transistor 22 is reduced below the threshold voltage $V_{TH}$ of the transisor 22 as will be seen from FIG. 9A. The second sense node $N_2$ is now completely isolated from the supply voltage $V_{DD}$ so that there is no current which flows through the second load transistor 22 with the result that only an extremely small amount of current $I_S$ is allowed to flow through the activating transistor at time $T_2$ as will be seen from FIG. 9B. With the second load transistor 22 turned off, furthermore, the potential at the second sense node $N_2$ declines from the level $V_{N2}$ to the ground level $V_{SS}$ immediately after time $T_1$ as will be seen from FIG. 9A.

As the potential on the bit line B further declines, the differential voltage between the gate and source of the first amplifier transistor 24 is reduced below the level of the threshold voltage $V_{TN}$ of the n-channel field-effect transistor 24, the transistor 24 is turned off as at time $T_3$ so that the current $I_S$ through the activating transistor 28 is reduced to the zero level as will be also seen from FIG. 9B.

Figure 10:
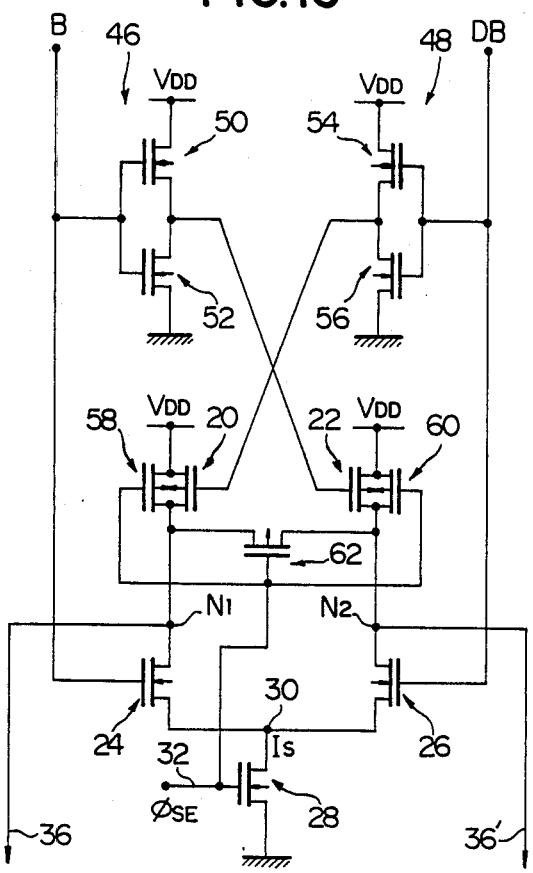
FIG. 10 is a circuit diagram showing the circuit arrangement of a fourth preferred embodiment of a differential amplifier circuit according to the present invention, the fourth embodiment being a modification of the embodiment shown in FIG. 9.

FIG. 10 shows a fourth preferred embodiment of a differential amplifier circuit according to the present invention. The differential amplifier circuit herein is basically similar in construction to the embodiment described with reference to FIG. 8 and features the provision of first and second precharge transistors 58 and 60 and a voltage equalizer transistor 62 in addition to the transistors 20, 22, 24, 26 and 28 and the CMOS inverters 46 and 48 provided in association with the bit line B and the dummy bit line DM in the sense amplifier of FIG. 8. Each of these transistors 58, 60 and 62 is provided by a p-channel MOS field-effect transistor.

The first and second precharge transistors 58 and 60 are provided in parallel with the first and second load transistors 20 and 22 and have their sources connected to the voltage supply line for the supply voltage $V_{DD}$ and their drains connected to the drains of the first and second amplifier transistors 24 and 26 through the first and second sense nodes $N_1$ and $N_2$, respectively. The voltage equalizer transistor 62 has one of its source and drain connected to the drains of the first load and precharge transistors 20 and 58 and the other of its source and drain connected to the drains of the second load and precharge transistors 22 and 60. In addition, the transistors 58, 60 and 62 have their gates connected commonly to the clock supply line 32 through which the active-high clock signal $\phi_{SE}$ is thus applied not only to the gate of the activating transistor 28 but also to the respective gates of the additional transistors 58, 60 and 62.

Figure 11:
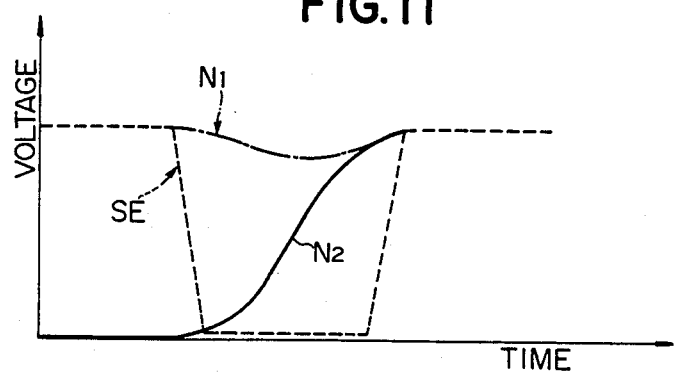
FIG. 11 is a timechart showing examples of the waveforms of some voltages to appear in the precharge arrangement of the sense amplifier circuit shown in FIG. 10.

When the active-high clock signal $\phi_{SE}$ shifts to a low level prior to the start of a read cycle, each of the precharge transistors 58 and 60 and voltage equalizer transistor 62 is activated to turn on. The first and second sense nodes $N_1$ and $N_2$ are thus precharged through the precharge transistors 58 and 60 to levels approximating the supply voltage $V_{DD}$ as shown in FIG. 11. In this instance, a path of current is formed between the first and second sense nodes $N_1$ and $N_2$ through the source and drain of the voltage equalizer transistor 62 so that the first and second sense nodes $N_1$ and $N_2$ are precharged to equal levels by the point of time the clock signal $\phi_{SE}$ thereafter shifts to a high level as will be seen from FIG. 11. The provision of the additional transistors 58, 60 and 62 is thus useful for speeding up the operation of the sense amplifier for each of the read cycles of, especially, a high-speed, low-power-dissipation static memory device in which active elements are to be reset by trigger signals generated in response to the edges of address signals. It will be apparent that the transistors 58, 60 and 62 provided in the embodiment of FIG. 10 may also be provided additionally to each of the embodiments of FIGS. 5 and 7.

What is claimed is:
1. A differential amplifier circuit comprising
  (a) a pair of mutually complementary bit lines connected to a row of memory cells arranged in rows and columns,
  (b) first and second load transistors each of the load transistors being implemented by a p-channel MOS field-effect transistor,

(c) first and second amplifier transistors each of the amplifier transistors being implemented by an n-channel MOS field-effect transistor, (d) said load transistors having their respective gates commonly connected to the respective drains of the first load transistor and the first amplifier transistor, said first and second amplifier transistors having their respective gates connected to said complementary bit lines, respectively, (e) an activating transistor through which said first and second amplifier transistors have their respective sources commonly connected to a first supply voltage line, said activating transistor being implemented by an n-channel MOS field-effect transistor and having its drain connected to the respective sources of said first and second amplifier transistors through a common node, its source connected to said first supply voltage line, and its gate connected to a clock supply line through which an active-high clock signal is to be supplied, (f) said second load transistor and said second amplifier transistor having their respective drains commonly connected through a node to an output line, and (g) first and second current cutoff transistors each of which is implemented by a p-channel MOS field-effect transistor, the first and second current cutoff transistors having their respective sources connected to a second voltage supply, their respective drains connected to the sources of the first and second load transistors, respectively, and their respective gates connect to said complementary bit lines through first and second inverters, respectively.

2. A differential amplifier circuit comprising (a) a pair of mutually complementary bit lines connected to a row of memory cells arranged in rows and columns, (b) first and second load transistors each of the load transistors being implemented by a p-channel MOS field-effect transistor, (c) first and second amplifier transistors each of the amplifier transistors being implemented by an n-channel MOS field-effect transistor, (d) said load transistors having their respective gates commonly connected to the respective drains of the first load transistor and the first amplifier transistor, said first and second amplifier transistors having their respective gates connected to said complementary bit lines, respectively, (e) first and second activating transistors through which said first and second amplifier transistors have their respective sources commonly connected to a first supply voltage line, said first and second activating transistors being implemented by an n-channel MOS field-effect transistors and having their respective drains connected to the respective sources of the first and second amplifier transistors their respective sources connected to said first supply line, and their respective gates commonly connected to a clock supply line through which an active-high clock signal is to be supplied, (f) said second load transistor and said second amplifier transistor having their respective drains commonly connected through a node to an output line, and (g) first and second current cutoff transistors each of which is implemented by a p-channel MOS field-effect transistor, the first and second current cutoff transistors having their respective sources connected to a second voltage supply, their respective drains connected to the sources of the first and second load transistors, respectively, and their respective gates connected to said complementary bit lines through first and second inverters, respectively.

3. A differential amplifier circuit comprising (a) a pair of mutually complementary input lines, (b) first and second amplifier transistors each of the amplifier transistors being implemented by an n-channel MOS field-effect transistor, said first and second amplifier transistors having their respective gates connected to said complementary input lines, respectively, (c) an activating transistor through which said first and second amplifier transistors have their respective sources commonly connected to a first supply voltage line, said activating transistor being implemented by an n-channel MOS field-effect transistor and having its drain connected to the respective sources of said first and second amplifier transistors through a common node, its source connected to said first supply voltage line, and its gate connected to a clock supply line through which an active-high clock signal is to be supplied, (d) first and second current cutoff transistors each of which is implemented by a p-channel MOS field-effect transistor, the first and second current cutoff transistors having their respective sources connected to a second voltage supply line, and their respective drains connected to the drains of the first and second amplifier transistors, respectively, (e) said first current cutoff transistor and said first amplifier transistor having their respective drains commonly connected through a first sense node to a first output line, and said second current cutoff transistor and said second amplifier transistor having their respective drains commonly connected through a second sense node to a second output line, and (f) first and second inverters through which said first and second current cutoff transistors have their respective gates connected to said complementary input lines, respectively, each of said first and second inverters comprising a series combination of a p-channel field-effect transistor having its source connected to said second voltage supply line and an n-channel field-effect transistor having its drain connected to the drain of the p-channel transistor of the same inverter and having its source connected to said first voltage supply line, the p-channel and n-channel transistors of the first inverter having their respective gates commonly connected to one of said input lines the p-channel and n-channel transistors of the second inverter having their respective gates commonly connected to the other of said input lines, the common drains of the transistors of said first inverter being connected to the gate of said second current cutoff transistor and the common drains of the transistors of said second inverter being connected at a second common node to the gate of said first current cutoff transistor.

4. A differential amplifier circuit comprising (a) a pair of mutually complementary input lines, (b) first and second amplifier transistors each of the amplifier transistors being implemented by an n- channel MOS field-effect transistor, said first and second amplifier transistors having their respective gates connected to said complementary input lines, respectively, (c) an activating transistor through which said first and second amplifier transistors have their respective sources commonly connected to a first supply voltage line, said activating transistor being implemented by an n-channel MOS field-effect transistor and having its drain connected to the respective sources of said first and second amplifier transistors through a common node, its source connected to said first supply voltage line, and its gate connected to a clock supply line through which an active-high clock signal is to be supplied, (d) first and second current cut off transistors each of which is implemented by a p-channel MOS field-effect transistor, the first and second current cutoff transistors having their respective sources connected to a second voltage supply, and their respective drains connected to the drains of the first and second amplifier transistors, respectively, (e) said first current cutoff transistor and said first amplifier transistor having their respective drains commonly connected through a first sense node to a first output line, and said second current cutoff transistor and said second amplifier transistor having their respective drains commonly connected through a second sense node to a second output line, (f) first and second inverters through which said first and second current cutoff transistors have their respective gates connected to said complementary input lines, respectively, each of said first and second inverters comprising a series combination of a p-channel field-effect transistor having its source connected to said second voltage supply line and an n-channel field-effect transistor having its drain connected to the drain of the p-channel transistor of the same inverter and having its source connected to said first voltage supply line, the p-channel and n-channel transistors of the first inverter having their respective gates commonly connected to one of said input lines and the p-channel and n-channel transistors of the second inverter having their respective gates commonly connected to the other of said input lines, the common drains of the transistors of said first inverter being connected to the gate of said second current cutoff transistor and the common drains of the transistors of said second inverter being connected to the gate of said first field-effect transistor, (g) first and second precharge transistors each implemented by a p-channel MOS field-effect transistor, the first and second precharge transistors being provided in parallel with said first and second current cutoff transistors, respectively, and having their respective sources connected to said second voltage supply line and their respective drains connected to the drains of said first and second amplifier transistors through said first and second sense nodes, respectively, and (h) a voltage equalizer transistor implemented by a p-channel MOS field-effect transistor, the voltage equalizer transistor having one of its source and drain connected to the drains of the first current cutoff and precharge transistors and the other of its source and drain connected to the drains of the second current cutoff and precharge transistors, said first and second precharge transistors and said voltage equalizer transistor having their respective gates connected commonly to said clock supply line.

* * * * *